(12) United States Patent
Giuroiu

(10) Patent No.: US 7,015,733 B2
(45) Date of Patent: Mar. 21, 2006

(54) SPREAD-SPECTRUM CLOCK GENERATOR USING PROCESSING IN THE BITSTREAM DOMAIN

(75) Inventor: Horia Giuroiu, Campbell, CA (US)

(73) Assignee: Oki Electric Industry Co., Ltd., Tokyo (JP)

( * ) Notice: Subject to any disclaimer, the term of this patent is extended or adjusted under 35 U.S.C. 154(b) by 177 days.

(21) Appl. No.: 10/682,839

(22) Filed: Oct. 10, 2003

(65) Prior Publication Data

US 2005/0077935 A1 Apr. 14, 2005

(51) Int. Cl.
*H03L 7/06* (2006.01)

(52) U.S. Cl. .................. 327/156; 327/159; 375/134; 375/363

(58) Field of Classification Search .............. 327/156, 327/158, 159; 331/14, 18, 19; 375/134, 137, 375/144–145, 362–364
See application file for complete search history.

(56) References Cited

U.S. PATENT DOCUMENTS

| 4,179,670 | A | | 12/1979 | Kingsbury | 331/10 |
|---|---|---|---|---|---|
| 5,311,542 | A | * | 5/1994 | Eder | 375/130 |
| 5,631,920 | A | | 5/1997 | Hardin | 375/130 |
| 5,872,807 | A | | 2/1999 | Booth et al. | 375/130 |
| 6,366,174 | B1 | * | 4/2002 | Berry et al. | 331/78 |

* cited by examiner

*Primary Examiner*—Timothy P. Callahan
*Assistant Examiner*—An T. Luu
(74) *Attorney, Agent, or Firm*—Volentine Francos & Whitt, PLLC

(57) ABSTRACT

A spread-spectrum phase-locked loop clock generator includes a PLL circuit, a modulation generator, a bit stream processor and a multiplexer. The modulation generator outputs a bitstream in response to an input signal and a control signal. The bitstream processor generates bitstream signals. The multiplexer outputs one of the bitstream signals in response to a frequency deviation control signal. The PLL circuit is controlled by the output of the multiplexer.

9 Claims, 9 Drawing Sheets

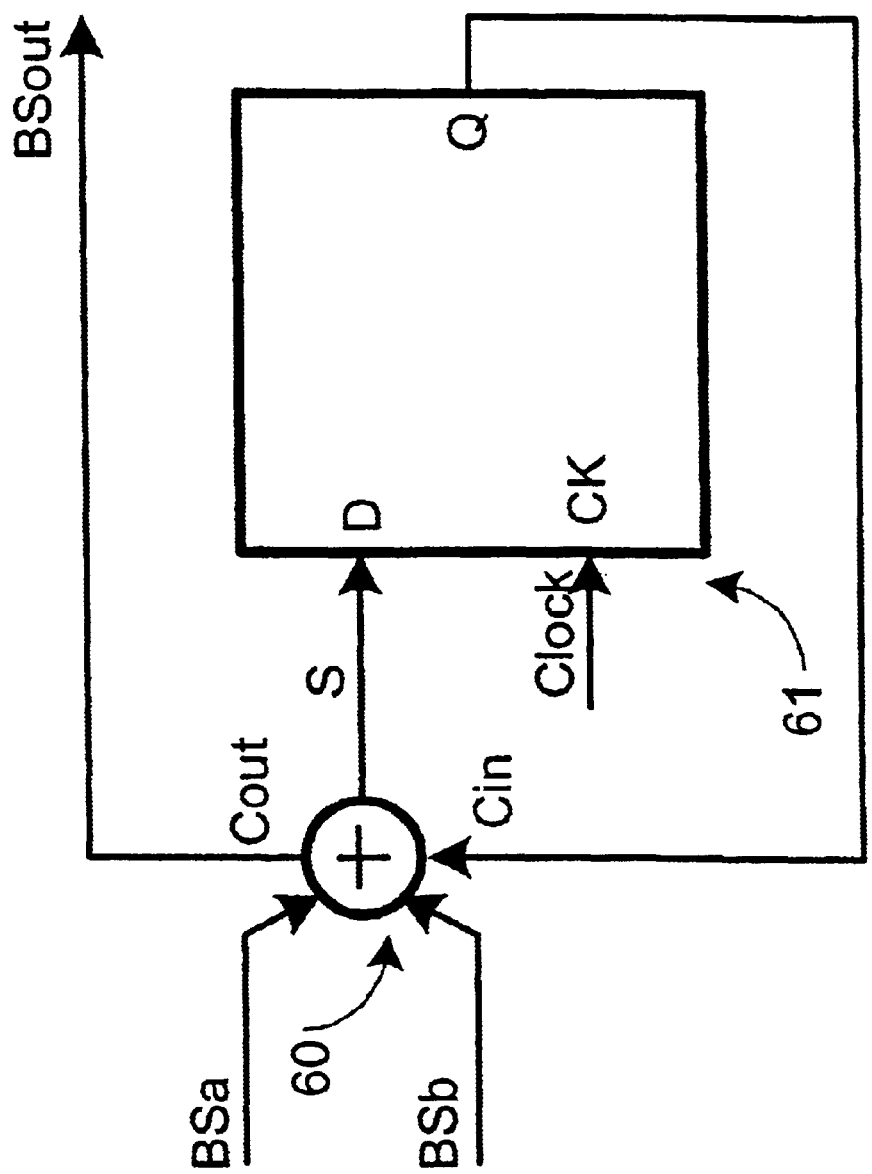

SPREAD-SPECTRUM CLOCK GENERATOR USING PROCESSING IN THE BITSTREAM DOMAIN

BACKGROUND OF THE INVENTION

The present invention relates to clock circuits and more particularly to a spread-spectrum phase-locked loop clock generator.

The functioning of a large class of electronic devices is governed by clock signals providing means for timing. Some electronic devices make use of high frequency clock signals, usually generated by multiplying through a frequency synthesizer a reference frequency coming from a high stability crystal-controlled oscillator.

The clock signals are, ideally, rectangular in shape, having energy concentrated at the fundamental frequency and at the integer multiples (harmonics) of this fundamental frequency (as shown in FIG. 1a). In certain situations, the energy of the high frequency harmonics can be large enough to cause disturbance in the functioning of other electronic devices through electromagnetic interference (EMI). The level of accepted electromagnetic interference is regulated by the Federal Communications Commission (FCC).

One way to reduce the amount of electronic interference is to slightly vary the frequency of the clock signal, as to spread the energy of the signal to a larger frequency band. This way, the contribution to electromagnetic interference is reduced at any particular frequency. The slight variation in frequency is usually achieved through frequency or phase modulation. The amount of reduction of the EMI, as well as the deviation of the frequency of the clock signal depend on the amplitude, frequency and shape of the modulation signal. A sketch of a process of spreading the spectrum by slightly down shifting the clock frequency is shown in FIG. 1b.

One way to spread the spectrum of the clock signal is to modulate the frequency of an oscillator operating in an open-loop mode, as disclosed in U.S. Pat. No. 5,631,920 to Hardin, or U.S. Pat. No. 5,872,807 to Booth et al.

Other approaches are based on a phase-locked loop (PLL) circuit. The phase-locked loop derives its output signal from a voltage-controlled oscillator (VCO). In a conventional PLL, an output signal of the VCO controls a programmable frequency divider, which provides a signal with a lower frequency to one input of a phase detector (PD). The programmable frequency divider divides the VCO output signal through a given integer number. A signal with a reference frequency is applied to another input of the phase detector. The signal with reference frequency comes directly from a reference frequency generator, or is derived, through a frequency divider, either fixed or programmable, from a reference frequency generator. The difference in phase between the divided VCO output and the reference frequency is transformed into a current or voltage, which is filtered by a loop filter (LF) and applied to a control input of the VCO. The loop acts to minimize the difference in phase between the two signals at the input of the frequency detector by changing the output frequency of the VCO. As a result, the frequency of the VCO output is a fractional multiple of the reference frequency. In order to modulate the output frequency of the PLL, a variable modulation signal is applied to a programmable feedback divider.

In order to divide the output frequency by non-integer numbers, the fractional-N technique makes use of rapidly varying the division factor among several integer numbers, selected as to provide over the time an average number equal to the desired non-integer number. See, for instance, the U.S. Pat. No. 4,179,670 Frequency synthesizer with fractional division ratio and jitter compensation, N. G. Kingsbury, Dec. 18, 1978.

SUMMARY OF THE INVENTION

According to the present invention, the frequency and the amplitude of a certain modulation signal, used to reduce the EMI of a PLL-based generated clock signal, can be easily controlled.

The present invention provides for a PLL circuit, which has a first input terminal receiving a first signal at an input frequency, a set of second input terminals receiving a set of modulation frequency control inputs, a third input terminal receiving a dither control signal and a set of fourth input terminals receiving a set of frequency deviation control inputs and an output terminal outputting a signal at an output frequency. An input divider circuit is connected to the first input terminal to generate an output signal at the reference frequency, equal to the input frequency divided by a first integer M. A prescaler circuit is connected to the output terminal for generating at an output node a frequency equal to the output frequency divided by a fixed second integer P. A second divider circuit is connected to the output node of the prescaler circuit for generating an output signal at the output of the prescaler frequency divided by a variable third integer N. The circuit includes a phase detector having a first input node connected to an output node of the input divider circuit and a second input node connected to an output node of the second divider circuit, and generating an output signal which is a function of the difference between the phases of the first divider and second divider output signals. A charge pump is connected to the phase detector. A loop filter is connected to an output node of the charge pump. A voltage-controlled oscillator (VCO) is connected to an output node of the loop filter and generates a signal at the output terminal. A modulation frequency generator circuit is connected to the first input terminal, to the set of second input terminals and to the third input terminal and generates a first modulation frequency. A modulation sequence generator circuit is connected to an output node of the modulation frequency generator and generates a main modulation bitstream sequence reflecting a modulation waveform with a given amplitude. A bitstream processor is connected to an output node of the modulation sequence generator and generates a set of bitstream signals with scaled-down amplitudes with respect to the main modulation bitstream sequence. A multiplexer circuit is connected to output nodes of the bitstream processor and selects one of these outputs to be replicated at an output node, under control of the frequency deviation control input terminals. The output signal of the multiplexer circuit controls the value of the variable third integer N. This way, the frequency of the signal at the output terminal vary in a predetermined manner, the energy of the signal being spread.

BRIEF DESCRIPTION OF THE DRAWINGS

FIG. 6a shows the schematic diagram of a bitstream adder.

DETAILED DESCRIPTION OF THE PREFERRED EMBODIMENTS

Figure 1A:
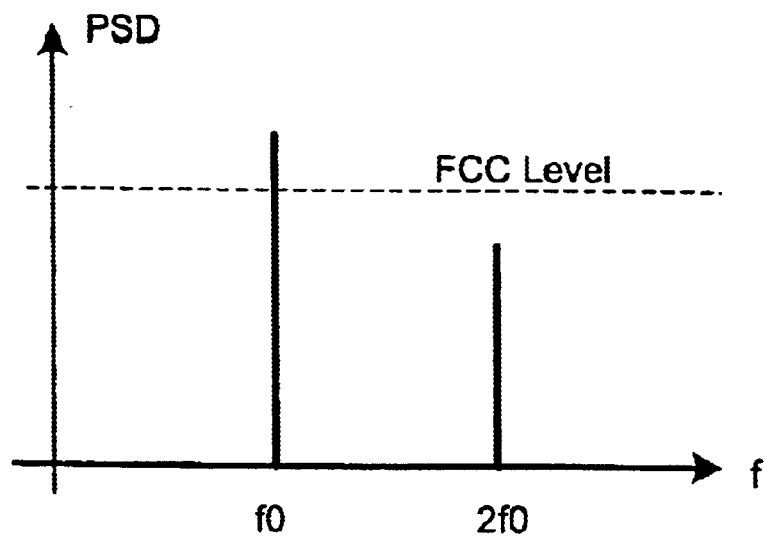
FIG. 1a shows the spectrum of an unmodulated signal.
Figure 1B:
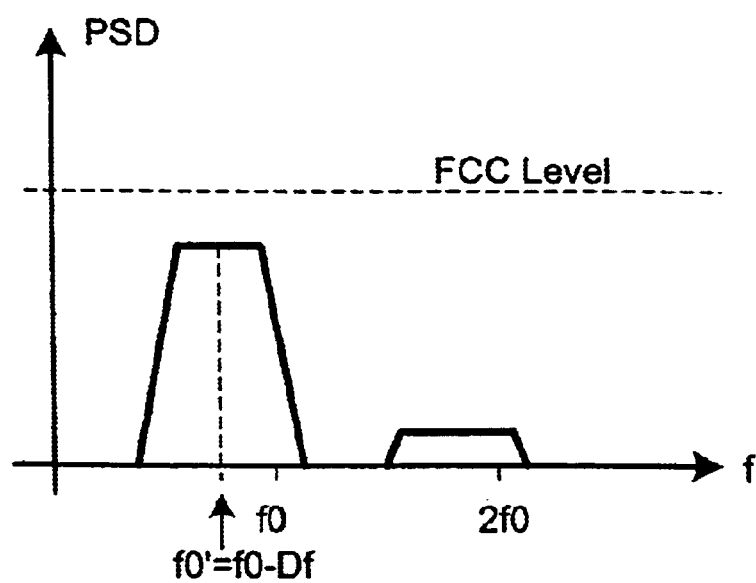
FIG. 1b shows the spectrum of a spread-spectrum signal.
Figure 2:
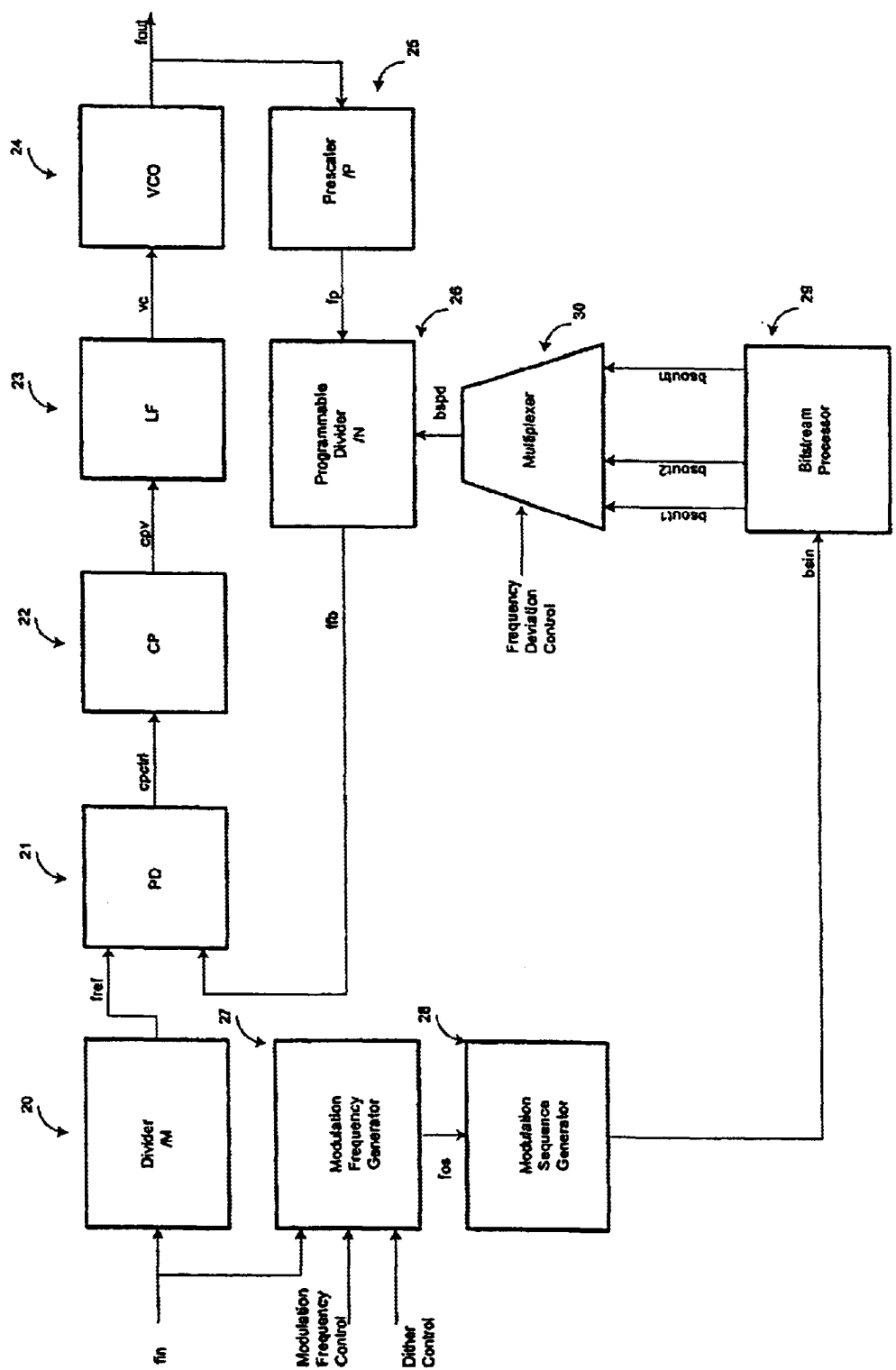
FIG. 2 shows a block diagram of a phase-locked loop in accordance with this invention.

FIG. 2 shows a block diagram of a PLL-based spread-spectrum clock generating circuit according to the present invention.

At a first input terminal, the circuit receives a signal with the frequency $f_{in}$ connected to an input of the input divider circuit 20 and to an input of the modulation frequency generator 27. The input divider circuit 20 generates an output signal at the reference frequency $f_{ref}$ equal to the input frequency divided by a first integer M:

$$f_{ref} = f_{in}/M.$$

The output of the input divider (signal $f_{ref}$) is connected to a first input of the phase detector 21. The output of the phase detector 21 (signal cpctr1) is connected to the input of a charge-pump circuit 22. The output of the charge pump (signal cpv) is connected to the input of a loop filter 23. The loop filter output (signal vc) is connected to the control input of the voltage-controlled oscillator (VCO) 24. The output node of the VCO is tied to an external output terminal and to the internal prescaler circuit 25. The output signal of the VOC has the frequency $f_{out}$. The internal prescaler 25 divides the frequency of the VCO output by a fixed number P:

$$f_p = f_{out}/P.$$

The prescaler 25 is connected to an input of the programmable divider 26. The circuit 26 divides the incoming signal by the integer number N and outputs a signal with the frequency:

$$f_{fb} = f_p/N.$$

The output of the programmable divider is connected to a second input of the phase detector 21. The spreading the spectrum of the output signal is achieved through the frequency or phase modulation of the generated signal by a low-frequency (usually in the order of tens of kHz, chosen as to be above the audible domain of the spectrum) periodic signal with controllable amplitude. The modulation signal spectrum is limited by the bandwidth of the PLL. The modulation signal can be a sine wave, a ramp, a triangle or any other shape which achieves the goal of spreading the spectrum of the output signal, preferably in an as uniform as possible manner.

This invention makes use of a modulation signal represented as a periodic one-bit words, called a bitstream. The bitstream is first generated off-line, by feeding a model of a sigma-delta modulator with the required modulation waveform and picking up a stream of a convenient length made of contiguous bits from the output of the modulator. The chosen bitstream is either stored in a ROM-like memory and repetitively read, or is repetitively generated inside the circuit by a finite state machine. The bitstream is clocked at a predetermined higher rate than the modulation signal, being the result of an oversampling process.

In various applications of a spread-spectrum clock generator, it is usually required to have the capability to program both the frequency of the modulation signal and the shift of the central frequency of the output signal.

The modulation frequency generator 27 has an input connected to the input signal $f_{os}$ and generates a $f_{os}$ signal used to clock the modulation sequence generator 28. The $f_{os}$ signal is generated from the $f_{in}$ signal under the control of the modulation frequency control and dither control sets of input signals. The modulation frequency generator achieves the goal of generating a variable and controllable oversampling frequency $f_{os}$. For reasons of spectrum flatness at the output of the spread-spectrum clock generator, the output of the modulation frequency generator can be dithered.

The modulation sequence generator 28 generates the bitstream bsin with the clock frequency $f_{os}$, according to the sequence determined off-line. The bitstream bsin corresponds to one frequency deviation. In order to make the frequency deviation programmable, the bitstream bsin is applied to a bitstream processor 29, which generates a set of bitstream outputs, corresponding to the same waveshape, but with lower amplitudes. The outputs of the bitstream processor 29 are the Bsout1, Bsout2 ..., Bsoutn bitstream signals.

In the present invention, the programmable divider 26 can be controlled as to have the division number N chosen between two values by a bitstream signal bspd. The signal bspd is one of the Bsout1, Bsout2, ..., Bsoutn signals, as selected by the multiplexer circuit 30, under the control of the frequency deviation control set of input signals. The programmable divider 26 changes the division factor synchronously with the $f_{fb}$ output signal of the circuit 26.

Figure 3A:
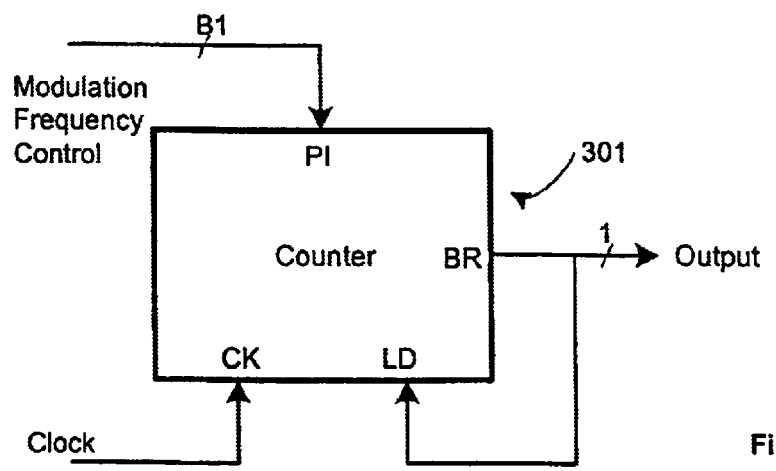
FIG. 3 shows a possible implementation of the Modulation Frequency Generator.

The modulation frequency generator structure depends on the values of $f_{in}$ and $f_{os}$. For a restricted set of modulation frequencies and for a enough value of the input frequency, it can be a simple programmable divider, as shown in FIG. 3a. The counter 301 is, in this example, counting downward, starting with a first predetermined value present at the PI inputs. This value is provided from outside the circuit, as the modulation frequency control digital word. The counter is clocked down by the Clock signal applied at the CK input. When the output BR reaches a second predetermined values, it activates the LD input, which allows the counter to re-load the first predetermined modulation frequency control value. This way, the counter can be made to divide the input signal by a value equal to the difference between the two predetermined numbers.

Figure 3B:
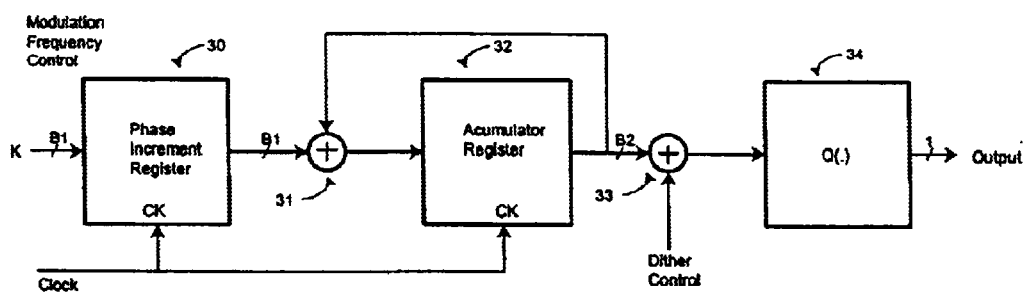

For a finer resolution of the generated oversampling frequency $f_{os}$, a well-known direct digital synthesis structure can be used (see. for instance, the application note "Direct Digital Synthesizer (DDS) V4.0", XILINX. Oct. 4, 2001). In order to improve the spectral smoothness of the $f_{os}$ signal, the DDS generator can be dithered. An example, for an elementary DDS, is shown in FIG. 3b. The circuit consists of a phase increment register 30, connected to the modulation frequency control inputs, a first adder 31, an accumulator register 32, a second adder 33 and a quantizer 34. The circuit 31 adds the outputs of the phase incrementer 30 and of the accumulator register 32. The second adder 33 adds the output of the accumulator register and a dither control signal. The quantizer 34 delivers to the output the value of the most significant bit of the accumulator register. Both circuits 30 and 32 are clocked on the same specified edge of the Clock signal. The modulation frequency control and the output of the register 30 are $B_1$ bits wide, the output of the register 32 is $B_2$ bits wide and the output of the quantizer 34 is only one bit wide. The frequency of the output of the DSS for a modulation frequency control value of K is:

$$[[f_{out}=K/2\Lambda\hat{}(B2)*f_{clock}]]f_{out}=K/2\hat{}B2)*f_{clock},$$

thus allowing a higher frequency resolution than the simple counter approach presented in FIG. 3a. In order to smoothen the spectrum of the generated clock, a dither signal can be applied at the dither control input.

Figure 5:
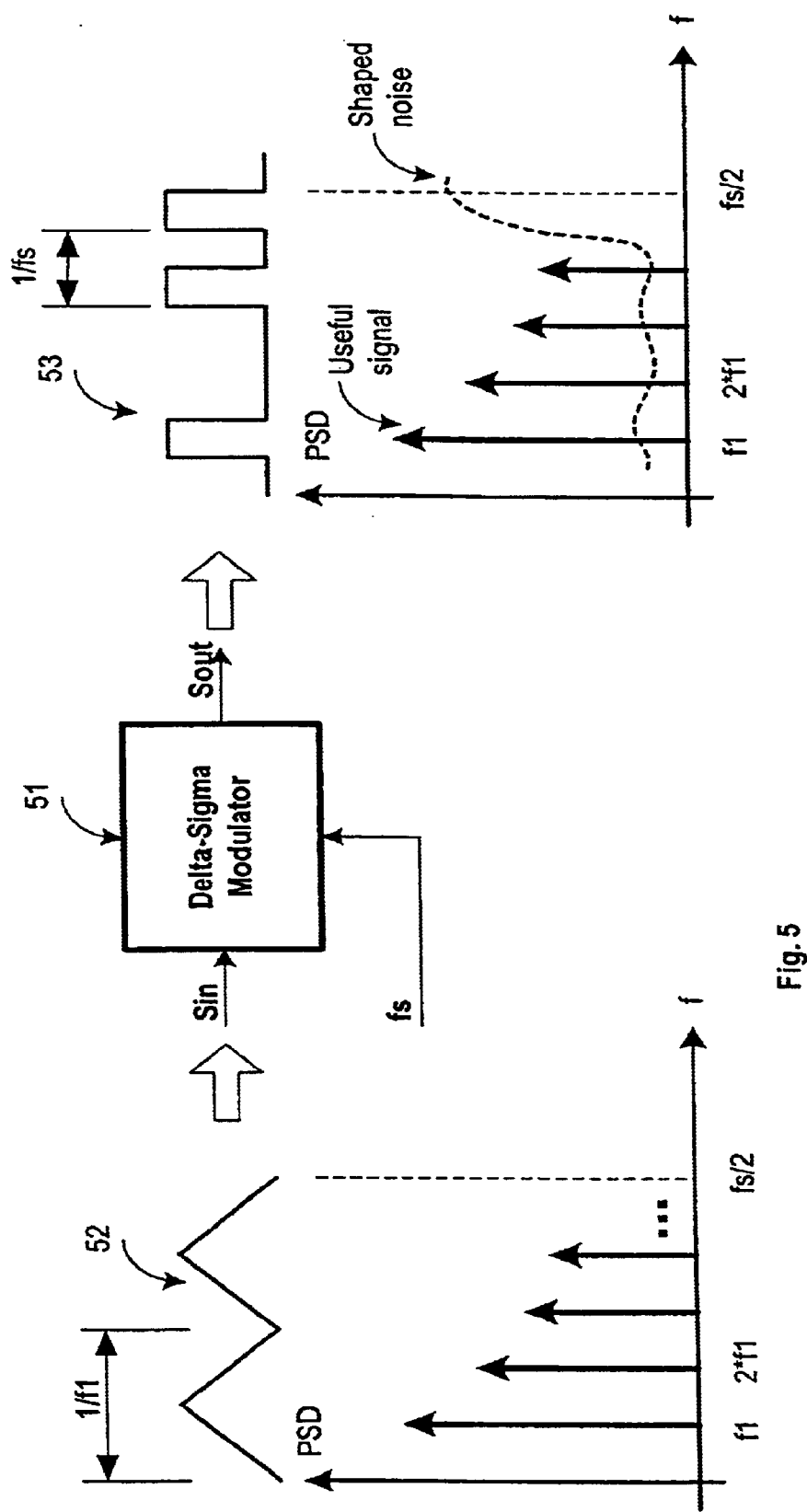
FIG. 5 shows a bitstream sequence generation process.

The sequence used to control the programmable frequency divider is a periodic sequence chosen from a bitstream generated by applying the desired modulation waveform to an appropriate model of a delta-sigma modulator and choosing a sequence which has a low level of spurious spectral components and also assures the desired flatness and smoothness properties of the output of the PLL (spread-spectrum clock signal). One can see the regular way of generating a bitstream illustrated in FIG. 5. The input 52 to the delta-sigma modulator 51 is a triangular waveform of frequency $f_1$, appropriately anti-alias filtered and sampled at $f_6$. The output sequence 53 is a stream of 1-bit words, which is non-periodic. The spectrum of the 53 sequence is a sum of the input signal spectrum and of high-pass shaped noise components (E. M. Hawrysh and G. W. Roberts, "An integration of memory-based analog signal generation into current DFT architectures," IEEE Trans. Instrumentation and Measurement, vol. 47, pp. 748–759, June 1998). For the use in the disclosed spread-spectrum generator, a bitstream sequence which completes an integer number of cycles inside the output stream is chosen.

Figure 4A:
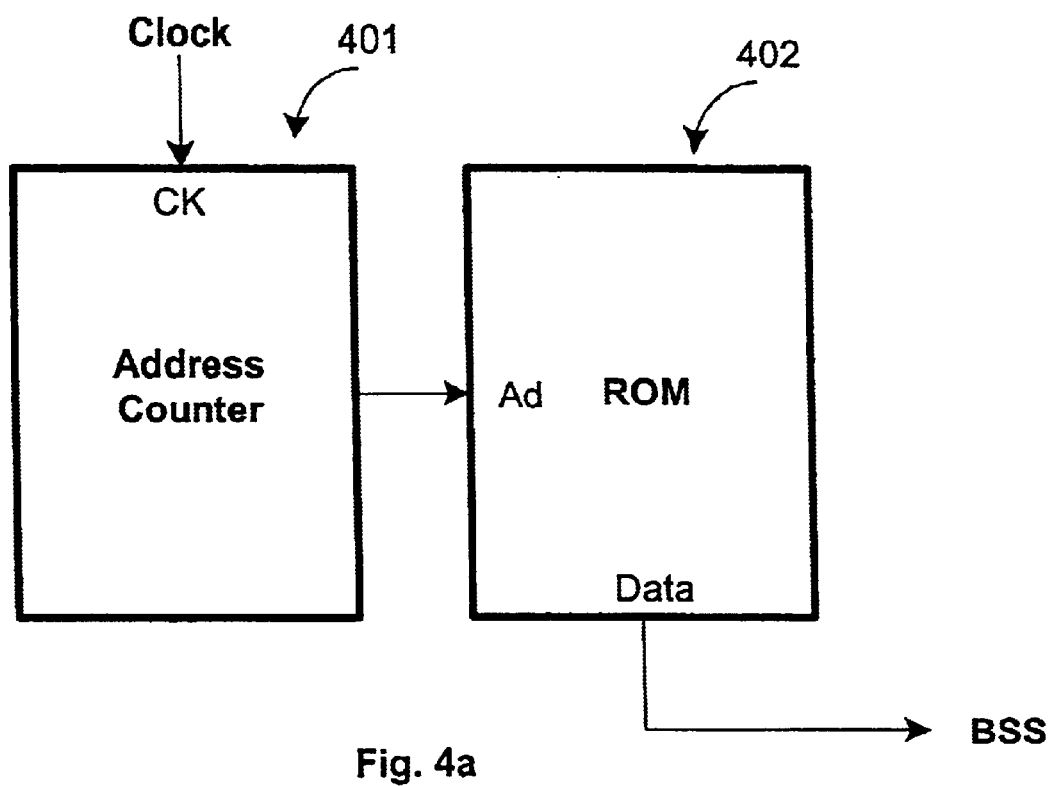
FIG. 4a shows the implementation of the Modulation Sequence Generator as a ROM-based circuit.
Figure 4B:
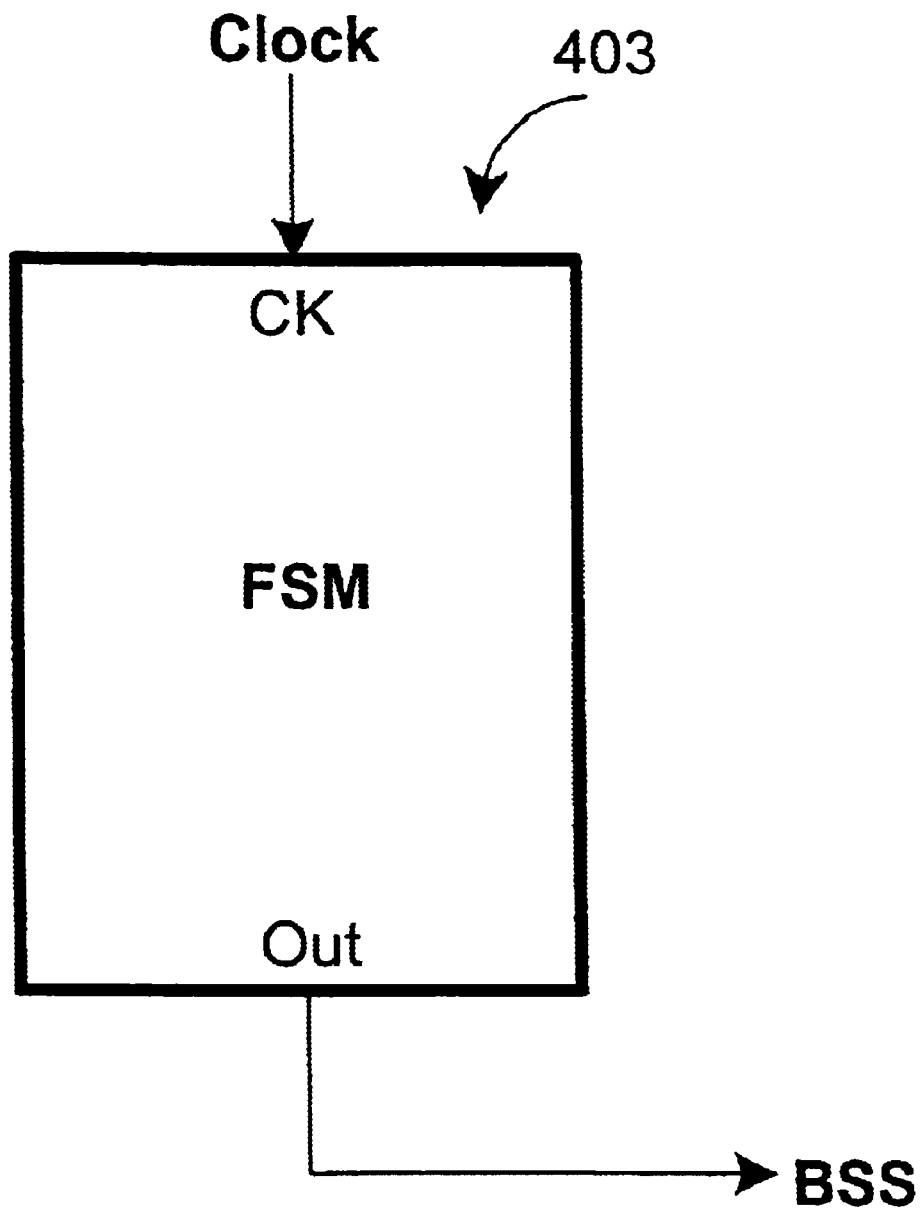
FIG. 4b shows the implementation of the Modulation Sequence Generator as a hardwired finite-state machine.

The modulation sequence generator 28 can be conventionally implemented, as in FIG. 4a, as a 1-bit output ROM 402, controlled by an address counter 401, clocked by the $f_{os}$ signal, or it can be synthesized as a finite state machine 403 generating the same sequence as a response to the clock signal $f_{os}$, as shown in FIG. 4b.

It is possible to obtain a bitstream sequence reflecting the half sum of two bitstream sequences with a circuit represented in FIG. 6a (A. Dahlia et al. "A multiplier-free digital RMS calculation unit for integrated Microsystems," in Proceedings of int. Workshop on Design of Mixed-Mode Integrated Circuits and Applications, Puerto Vallarta, Mexico, pp. 183–186, 1999). The input bitstreams BSa, BSb are applied to the sum inputs of a 1 bit full adder 60. The sum output S of the adder is applied to the data input of a D flip-flop 61, controlled by a Clock signal. The Q output of the flip-flop is connected to the carry input Cin of the full adder 60. The bitstream BSout=(BSa+BSb)/2 is generated at the carry output Cout of the adder 60.

In order to obtain downspread frequency deviations like 4%, 2%, 1%, 0.5% for the output of the spread-spectrum clock generator, one can conveniently start with a 8% deviation bitstream sequence and divide it down to the desired values through a cascade of bitstream adders with a zero second input. This implementation is illustrated in FIG. 6b, for a 4%, 3%, 2%, 1%, 0.5% outputs generated from a single input bitstream sequence corresponding to a 8% frequency deviation.

Figure 6B:
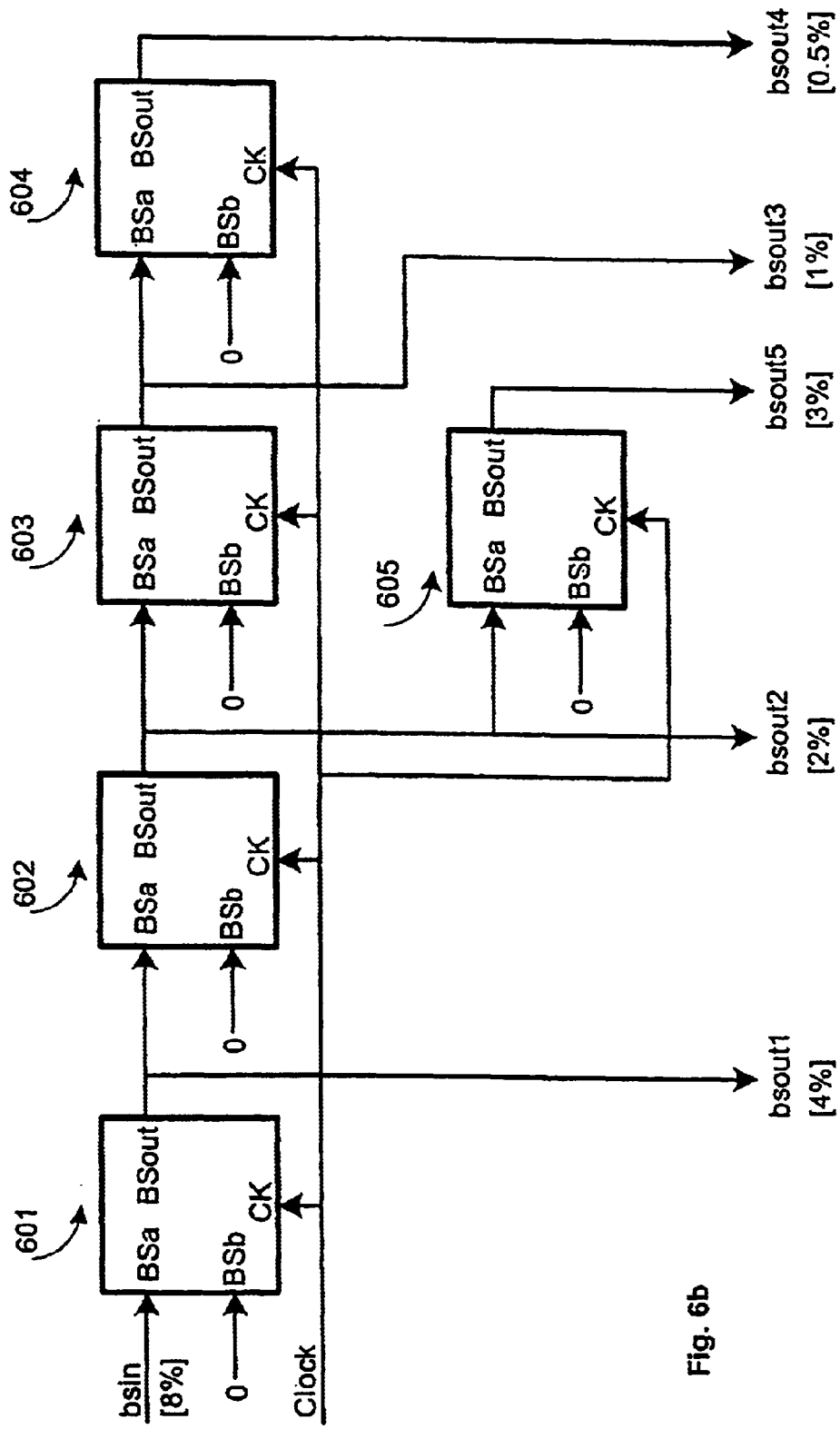
FIG. 6b shows the block diagram of a bitstream processor.

For the circuit of FIG. 6b, the input sequence bsin is applied to a BSa input of the bitstream adder 601, while the BSb input is kept in 0. The output bsout1 is half of the input bsin. The output BSout of the bitstream adder 601 is tied to the input BSa of the bitstream adder 602 and to the input BSa of the bitstream adder 605. The BSb input of the bitstream adder 602 is kept in 0. The output bsout2 is half of the output bsout1. The output BSout of the bitstream adder 602 is tied to the input BSa of the bitstream adder 603 and to the input BSa of the bitstream adder 605. The BSb input of the bitstream adder 603 is kept in 0. The output bsout3 is half of the output bsout2. The output BSout of the bitstream adder 603 is tied to the input BSa of the bitstream adder 604. The BSb input of the bitstream adder 604 is kept in 0. The output is half of the output bsout3. The output BSout of the bitstream adder 605 is half of the sum of the bitstreams bsout1 and bsout2. This way, for a 8% deviation sequence applied at the bsin input one can obtain 4%, 3%, 2%%, 1%, 0.5% deviations at the bsout1, bsout2, bsout3, bsout4, bsout5 outputs, respectively. All bitstream adders are controlled by the same clock.

One can look at the 601, 602, 603, 604 cascade of bitstream adders as a unidimensional array of ½ dividers, while the unidimensional array completed with the bitstream adder 605 can be regarded as a bidimensionally expanded array of bitstream adders. The expansion in two dimensions allows the generation of frequency deviations which are not powers of ½ with respect to the input sequence. In principle, any number smaller than the input deviation can be derived in this way, following a binary number generation like procedure.

An example of implementation has a $f_{in}$ between 10 MHz and 25 MHz, $f_{out}$=400 MHz, M=2, programmable division factors N={9, 10}, M=2, a modulation frequency fmod of 20 kHz to 40 kHz, with a PLL bandwidth of 200 kHz and a bitstream sequence of 128 bits.

Figure 7:
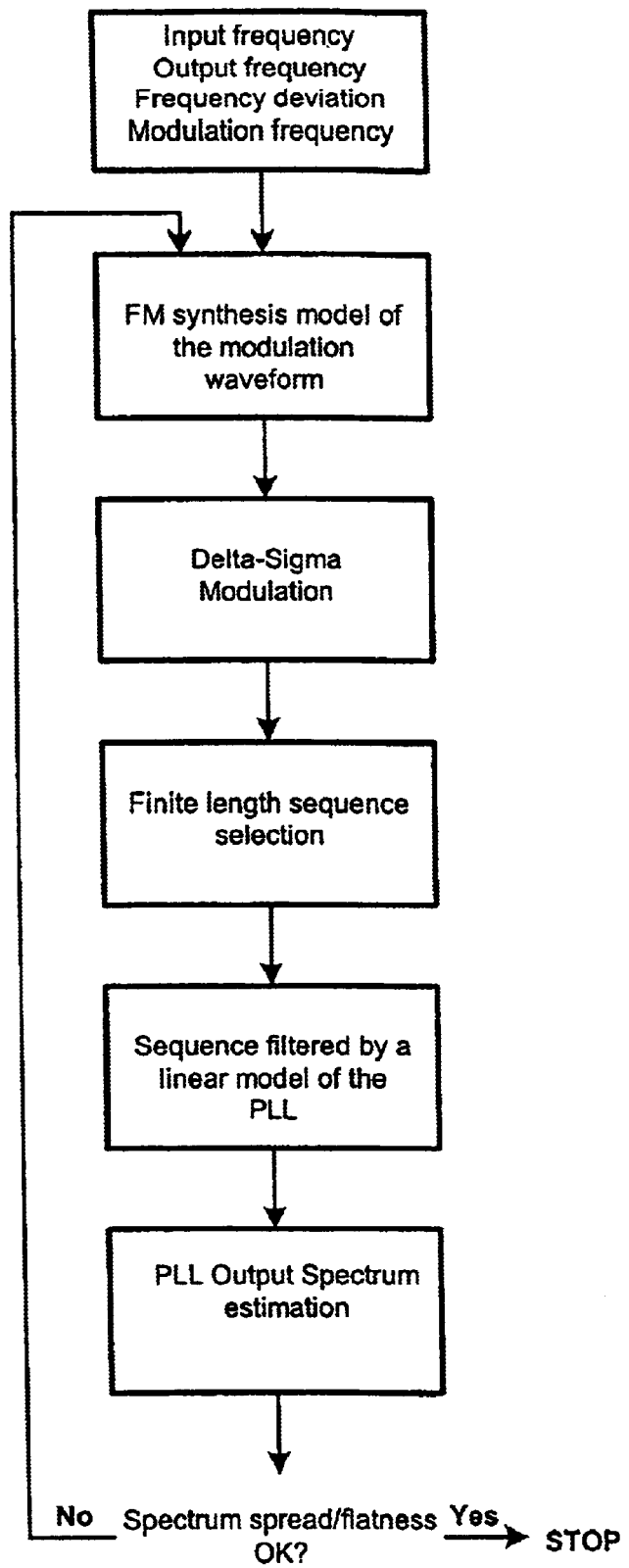
FIG. 7 shows the block diagram of the process of off-line generating the Modulation Sequence.

In FIG. 7, it is represented a flowchart of the finite length sequence generation. The input parameters are the input and output frequencies of the PLL, the desired output frequency deviation and the modulation signal frequency. The next step is to generate the parameters of a FM-synthesis model of the input waveform. The waveform generated according to these parameters enters a delta-sigma modulator model, clocked at an appropriate frequency, which generates a non-repetitive bitstream. A coherent bitstream is selected from the delta-sigma modulator output. The finite length sequence is repeated periodically. The periodic sequence is filtered by a linear model of the PLL and the spectrum at the output the PLL is checked for spread and flatness. In case the results are not conform with the specs, the parameters of the FM-synthesis model are altered and the spectrum evaluation process is re-started. The finite length selection can be a local repetitive process by itself, some of the sequences generating a smoother spectrum than others.

What is claimed is:

1. A phase-locked loop based spread-spectrum clock generator comprising:

a first input terminal receiving a first signal at an input frequency;

a plurality of second input terminals receiving a plurality of modulation frequency control inputs;

a third input terminal receiving a dither control signal;

a plurality of fourth input terminals receiving a plurality of frequency deviation control inputs;

an output terminal outputting a signal at an output frequency;

an input divider circuit connected to the first input terminal to generate an output signal at the reference frequency, equal to the input frequency divided by a first integer M;

a prescaler circuit connected to the output terminal for generating at an output node a frequency equal to the output frequency divided by a fixed second integer P;

a second divider circuit connected to the output node of the prescaler circuit for generating an output signal at the output of the prescaler frequency divided by a variable third integer N;

a phase detector having a first input node connected to an output node of the input divider circuit and a second input node connected to an output node of the second divider circuit, and generating an output signal which is a function of the difference between the phases of the first divider and second divider output signals;

a charge pump connected to the phase detector;

a loop filter connected to an output node of the charge pump;

a voltage-controlled oscillator connected to an output node of the loop filter, which generates a signal at the output terminal;

a modulation frequency generator circuit connected to the first input terminal, to the second input terminals and to the third input terminal, which generates a first modulation frequency;

a modulation sequence generator circuit connected to an output node of the modulation frequency generator, which generates a main modulation bitstream sequence reflecting a modulation waveform with a given amplitude;

a bitstream processor connected to an output node of the modulation sequence generator, which generates a plurality of bitstream signals with scaled-down amplitudes with respect to the main modulation bitstream sequence;

a multiplexer circuit connected to output nodes of the bitstream processor, which selects one of these outputs to be replicated at an output node, under control of the frequency deviation control input terminals;

means to connect the output of the multiplexer to an input of the second divider, in order to select the variable third integer N.

2. A phase-locked loop based spread-spectrum clock generator according to claim 1 wherein the modulation sequence is a bitstream obtained from a delta-sigma sequence.

3. A phase-locked loop based spread-spectrum clock generator according to claim 2, wherein the modulation sequence is repeated periodically in order to generate the modulation waveform.

4. A phase-locked loop based spread-spectrum clock generator according to claim 3, wherein the modulation frequency generator circuit is a programmable counter.

5. A phase-locked loop based spread-spectrum clock generator according to claim 3, wherein the modulation frequency generator circuit is of a direct digital synthesis type.

6. A phase-locked loop based spread-spectrum clock generator according to claim 3, wherein the modulation sequence generator is a ROM containing the modulation sequence, together with a counter connected to the address lines of the ROM and generating all the addresses in sequence.

7. A phase-locked loop based spread-spectrum clock generator according to claim 3, wherein the modulation sequence generator is a finite state machine generating the modulation sequence.

8. A phase-locked loop based spread-spectrum clock generator according to claim 3, wherein the bitstream processor is a unidimensional cascade of bitstream adders, connected in such a way as to obtain frequency deviations which are powers of ½ with respect to the input of the bitstream processor.

9. A phase-locked loop based spread-spectrum clock generator according to claim 3, wherein the bitstream processor includes a bidimensional array of bitstream adders, connected such a way as to obtain frequency deviation factors which are not powers of ½ with respect to the input of the bitstream processor.

* * * * *